United States Patent [19]
Yakubowski

[11] Patent Number: 5,268,814
[45] Date of Patent: Dec. 7, 1993

[54] MODULE PACKAGING

[75] Inventor: Carl Yakubowski, Staatsburg, N.Y.

[73] Assignee: International Business Machines Corporation, Armonk, N.Y.

[21] Appl. No.: 886,117

[22] Filed: May 20, 1992

[51] Int. Cl.$^5$ .................................................. H05K 7/20
[52] U.S. Cl. .................................. 361/704; 174/16.3; 174/52.3; 257/713; 361/707
[58] Field of Search ............... 174/16.3, 52.3; 357/74, 357/81; 361/382, 383, 385–389, 392, 394

[56] References Cited

U.S. PATENT DOCUMENTS

| | | | |
|---|---|---|---|
| 3,597,663 | 8/1971 | Markarian | 174/523 |
| 3,876,926 | 4/1975 | Schutt et al. | 361/389 |
| 4,159,221 | 6/1979 | Schuessler | 174/52.3 |
| 4,254,431 | 3/1981 | Babuka et al. | 174/16.3 |
| 4,514,752 | 4/1985 | Engel et al. | 357/72 |
| 4,685,211 | 8/1987 | Hagihara et al. | 29/832 |
| 4,879,629 | 11/1989 | Tustaniwskyj et al. | 361/385 |
| 4,914,812 | 4/1990 | Webster | 29/831 |
| 4,949,219 | 8/1990 | Moriizumi et al. | 361/386 |
| 4,999,741 | 3/1991 | Tyler | 361/387 |
| 5,109,318 | 4/1992 | Funari et al. | 361/388 |

Primary Examiner—Gregory D. Thompson
Attorney, Agent, or Firm—Floyd A. Gonzalez; Aziz M. Ahsan

[57] ABSTRACT

In a thermal conduction cooling system used in electronic packaging having a hermetic seal and sealing force between a substrate with mounted electronic devices and a cooling cap to prevent the corrosion of the mounted electronic devices during their operation, an improved seal employing an acrylic film which acts both as a hermetic seal and as an adhesive to provide a suitable sealing force between the cold plate and substrate.

6 Claims, 1 Drawing Sheet

MODULE PACKAGING

BACKGROUND OF THE INVENTION

1. Technical Field

This present invention pertains to electronic packaging technology, and more particularly, to the packaging of modules comprising electronic devices mounted on a substrate disposed under a cap or cold plate.

The high circuit densities in modern integrated circuit devices require that the heat generated by their operation be efficiently removed in order to maintain the temperature of the devices within the limits that will keep the operating parameters of the devices in a predetermined range, and also prevent the destruction of the device by overheating.

Cooling of electronic devices can be achieved by immersing the devices in a suitable liquid coolant. However, these cooling techniques can result in corrosion of the device and substrate metals, and also present rework problems. Another type of cooling known as thermal conduction cooling provides a conducting link of material between the device and the cap or cold plate.

In thermal conduction type cooling system, it is important to maintain a hermetic seal and sealing force between the substrate and the cooling cap to prevent the corrosion of the electronic devices and the interconnect circuitry. Moreover, because of the ambient atmospheric temperature between the electronic devices on the substrate and the cap or cold plate, the atmosphere becomes highly humid. Gases such as nitrogen or helium may be introduced at a predetermine pressure during assembly so as to maintain a dry atmosphere after the assembly is sealed. Such a sealed system enhances the reliability of the circuitry and deterioration is prevented.

This invention is an improved method to seal and assemble thermal conduction type cooling systems.

2. Background of the Invention methods to seal and assemble of thermal conduction type cooling systems.

U.S. Pat. No. 4,949,219 issued Aug. 14, 1990 to Moriizumi et al. for "Module Sealing Structure" discloses a polimide layer formed on the surface on the substrate and a metallic conductor layer formed on the polyimide layer. The seal is secured using mechanical fasteners such as screws.

U.S. Pat. No. 4,999,741 issued Mar. 12, 1991 to Tyler for "Package in the Heat Dissipation of Electronic Devices" discloses a thermally conducting flexible membrane capable of being urged into thermal contact with an electronic device producing a simple hermetic seal as well as contact with the electronic device.

U.S. Pat. No. 4,514,752 issued Apr. 30, 1985 to Engel et al. for "Displacement Compensating Module" discloses a blocking article, such as polyimide tape, for inhibiting movement of an epoxy composition into a gap area during manufacturing of a thermal conduction cooling assembly.

U.S. Pat. No. 4,685,211 issued Aug. 11, 1987 to Hagihara et al. for "Method of Producing a Cooled Electronic Assembly" discloses a cooling plate assembly secured by mechanical fasteners such as screws.

U.S. Pat. No. 4,914,812 issued Apr. 10, 1990 to Webster for "Method of Self-Packaging an IC Chip" discloses a method of self packaging an integrated chip on a printed circuit board where the conductive leads form an electrical connection with interconnect leads on the printed circuit board.

SUMMARY OF THE INVENTION

The present invention provides an improved method for sealing and maintaining a sealing pressure between a substrate with mounted electronic devices and a cold plate used in thermal conduction cooling assemblies.

It is a primary object of the present invention to provide an adhesion force between a substrate with mounted electronic components and a cold plate employing acrylic thin film as an adhesive. The acrylic thin film is heated to its glass transition temperature, at which the acrylic softens. A constant pressure is applied to urge the cold plate onto the substrate. After cooling the pressure is removed and the module is held together through the hardened acrylic bond.

It is another object of the present invention to provide a hermetically sealed juncture between the substrate with mounted electronic devices and the cold plate through the hardened acrylic bond.

It is yet another object of this present invention to provide additional sealing characteristics through use of an "O" ring between the cold plate and the substrate. Upon assembly, the "O" ring becomes compressed in between the substrate and the cold plate.

It is still another object of this present invention to provide a improved sealing method by reducing point stresses and regional strains caused by the conventional thermal conduction assembly packing methods employing a variety of fasteners or screws to urge the substrate into the cold plate.

It is a still further object of this present invention to provide a method of disassembly for a thermal conduction cooling assembly through heating the acrylic film up to the it glass transition temperate and gently urging the substrate from the cold plate.

The foregoing and other objects, features and advantages of the invention will be apparent from the following more particular description of the preferred embodiment of the invention as illustrated in the drawings.

DISCLOSURE OF THE PREFERRED EMBODIMENT

Figure 1:
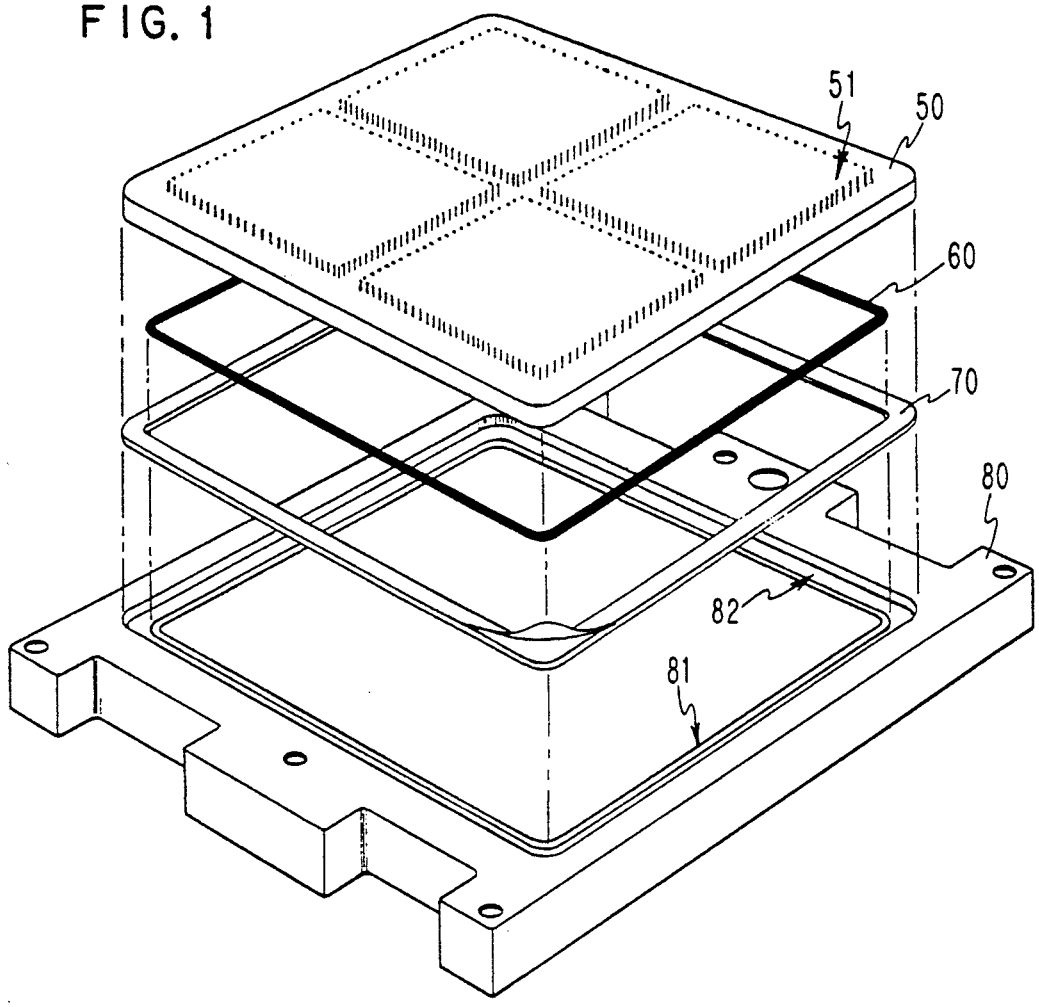
FIG. 1 is an exploded view of an assembly, having a substrate with electronic devices to be cooled, an "O" ring, an acrylic ring and a cold plate.
Figure 2:
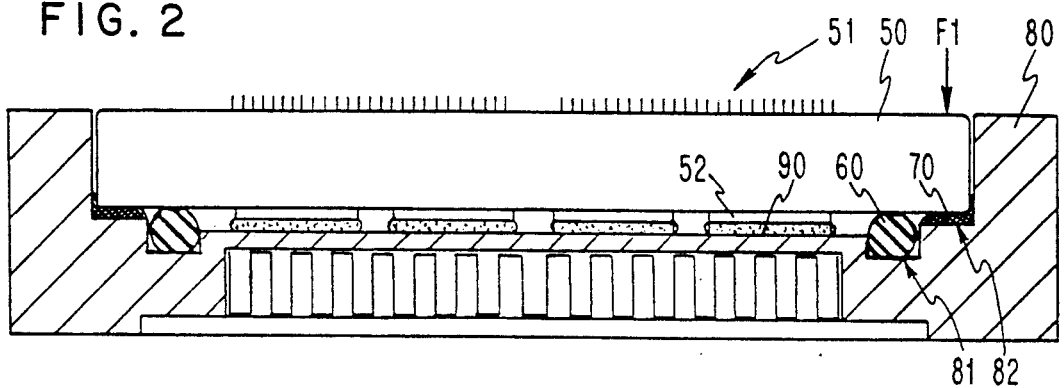
FIG. 2 is a cross sectional view illustrating the relationship of the electronic devices to be cooled, the "O" ring, an acrylic ring and a cold plate.

Referring now to FIG. 1, there is depicted a typical electronic package having substrate 50, with disposed electrical pin contacts 51 and cold plate 80. In between the substrate 50 and the cold plate 80 is elastomer "O" ring 60 and acrylic thin film 70. Substrate 50 can be formed of any dielectric material and contains suitable circuitry for interconnecting devices on the lower surface using solder bonds (not shown). Substrate 50 can be formed of inorganic resins, ceramic or any suitable dielectric material. Referring to FIG. 2, substrate 50 is typically provided with a metallurgy pattern (not shown) within or on its bottom surface that interconnects the devices 52 thereon. The heat generated in devices 52 is partially conducted away from the devices though solder connections to the substrate 50 which acts as a heat sink. However, it is usually necessary to conduct the major portion of the heat generated in the devices from the lower surface of the devices through a thermal bridge element 90 to the liquid cooled cold plate 80.

This invention is a method to seal and assemble thermal conduction type cooling systems using an acrylic film.

Referring to FIG. 1, the details of the sealing method and the assembly of the thermal conduction cooling system will be described. The acrylic film is a thin film (e.g. 0.004 inches thick) of acrylic adhesive, such as material manufactured by E. I. Du Pont De Nemours with paper carrier tacked to the bottom and top surfaces under the trademark Pyralux. As shown in FIG. 1, the cold plate 80 contains two chamfered regions 81 and 82. The "O" Ring 60 is aligned in the chamfered region 81 and the acrylic film 70 is aligned in chamfered region 82. The substrate 50 is aligned in chamfered region 82 on top of the acrylic film 70. The acrylic film 70 is heated to its glass transition temperature which is greater than the normal operating temperature of the substrate 50 and the attached electronic devices 52. The chamber holding the aligned thermal conduction cooling assembly is evacuated and a clamping force F1 is applied using, for example, bolts or clamps to press substrate 50 onto cold plate 80, compressing the acrylic film 70 and elastomer "O" ring 60. A suitable clamping force, typically around 50 psi is maintained while the acrylic thin film 70 is held at its glass transition temperature for approximately sixty minutes. The acrylic thin film 70 is allowed to cool to room temperature, after which time the clamping force F1 is removed. The thermal conduction assembly is held together through the adhesion characteristic of the hardened acrylic thin film 70. The hardened acrylic thin film 70 forms a hermetic seal. Additional sealing properties are achieved by the compressed elastomer "O" ring 60 sandwiched in between substrate 50 and cold plate 80.

To disassemble the thermal conduction cooling assembly. The acrylic thin film is heated to its glass transition temperature. Using a low positive pressure, substrate 50 is gently urged from cold plate 80. Upon separation, substrate 50 and the cold plate 80 are cooled to room temperature and disassembly is complete.

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letter Patent is:

1. A method of joining an electronic thermal conduction cooling assembly using an acrylic film comprising the steps of:

providing a cold plate for cooling electronic devices, said cold plate having an area to accommodate said electronic devices to be cooled;

providing a substrate having at least one electronic device mounted thereon in a central region of said substrate, said substrate further have a margin area extending on all sides past the central region;

aligning an acrylic thin film on said cold plate, said acrylic thin film having an open central area therein defining a cooling region;

providing means for conducting a portion of the heat generated in said electronic devices to said cold plate, wherein said means for heat conduction is through a thermal bridge element;

locating said substrate on said cold plate with the electronic device mounted on said central region of said substrate being within the cooling region defined by the open central area of said acrylic thin film, and the margin area of said substrate overlaying said acrylic thin film around said central open area such that said acrylic thin film is trapped between said cold plate and the margin area of said substrate;

heating said acrylic thin film until it softens between the margin area of said substrate and said cold plate;

applying a force to urge said thermal conduction cooling assembly together;

cooling said acrylic thin film while said thermal conduction assembly is urged together, thereby forming a bond between said substrate and said cold plate.

2. The method defined in claim 1, wherein the heating step includes forming a hermetic seal between said substrate and said cold plate with said acrylic thin film.

3. The method defined in claim 1, wherein the locating step includes locating an elastomer "O" ring around the central region of said substrate and being between said margin area of said substrate and said cold plate for providing a seal between said cold plate and the margin area of said substrate.

4. A method of disassembling an electronic thermal conduction cooling assembly having a substrate, at least one device mounted on said substrate, a cold plate located over and in close proximity to the device and an acrylic thin film located around the outer perimeter of said substrate between said cold plate and said substrate, comprising the steps of:

heating said acrylic thin film until it softens between said substrate and said cold plate;

applying a force to separate said thermal conduction cooling assembly apart; and cooling said acrylic thin film after said thermal conduction assembly is separated.

5. An electronic thermal cooling assembly comprising:

a cold plate for removing heat from the electronic assembly, said cold plate having an area to accommodate electronic devices to be cooled;

a means for conducting a portion of the heat generated in said electronic device to said cold plate, wherein said means for heat conduction is through a thermal bridge element;

an acrylic thin film on said cold plate, said acrylic thin film having an open central area therein defining a cooling region; and a board having a central region on which said electronic devices to be cooled are mounted, said electronic devices being within the cooling region defined by the open central area of said acrylic thin film, said board further having a margin area extending over said acrylic thin film for trapping said acrylic thin film between said cold plate and the margin area of said board around the cooling region defined by the central open area of said acrylic thin film;

said acrylic thin film forming a bond between said board and said cold plate when heated to a glass transition temperature which is higher than the operating temperature of said electronic devices.

6. The electronic thermal cooling assembly of claim 5 further comprising:

an elastomer "O" ring around the central region of said board and between said board and said cold plate for forming a seal between said board and said cold plate bonded by said acrylic thin film.

* * * * *